(12) United States Patent
Peterson et al.

(10) Patent No.: US 7,161,851 B2
(45) Date of Patent: Jan. 9, 2007

(54) METHOD AND APPARATUS FOR GENERATING MULTIPLE SYSTEM MEMORY DRIVE STRENGTHS

(75) Inventors: Steven A. Peterson, Sacramento, CA (US); Razi Uddin, Orangevale, CA (US); Vishal Sharma, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 10/041,948

(22) Filed: Jan. 7, 2002

(65) Prior Publication Data

US 2003/0128596 A1 Jul. 10, 2003

(51) Int. Cl.
*G11C 7/00* (2006.01)

(52) U.S. Cl. .................... 365/189.11; 365/189.09; 365/228; 326/30; 326/86; 327/108; 327/333; 327/334; 327/519

(58) Field of Classification Search ............ 326/30, 326/86; 327/108, 109, 333, 334, 519; 365/185.23, 365/185.24, 185.25, 189.09, 189.11, 228; 711/104

See application file for complete search history.

(56) References Cited

U.S. PATENT DOCUMENTS

| 5,854,638 | A | * | 12/1998 | Tung ..................... 345/542 |
| 6,298,426 | B1 | | 10/2001 | Ajanovic ................ 711/172 |
| 6,604,065 | B1 | * | 8/2003 | Blomgren et al. .......... 703/15 |

OTHER PUBLICATIONS

"EMC Guidelines for MPC500–Based Automotive Powertrain Systems," Stevan Dobrasevic, Mar. 11, 2002.*

* cited by examiner

*Primary Examiner*—Christian P. Chace
(74) *Attorney, Agent, or Firm*—Fish & Richardson P.C.

(57) ABSTRACT

A system and method for generating multiple drive strengths for one or more output signals of a memory controller operable to control a memory subsystem. The system includes a state machine operable to generate an n-bit output representative of a drive strength operable to drive the one or more output signals; and a plurality of adders, each adder having a plurality of n-bit inputs, each input receiving a selective set of bits from the n-bit output of the state machine, the adders generating a plurality of n-bit outputs representative of drive strengths operable to drive the output signals. The method includes generating an n-bit output representative of a drive strength, and adding combinations of two or more selective sets of bits from the n-bit output to generate a plurality of n-bit outputs representative of a plurality of drive strengths that are operable to drive the output signal.

26 Claims, 7 Drawing Sheets

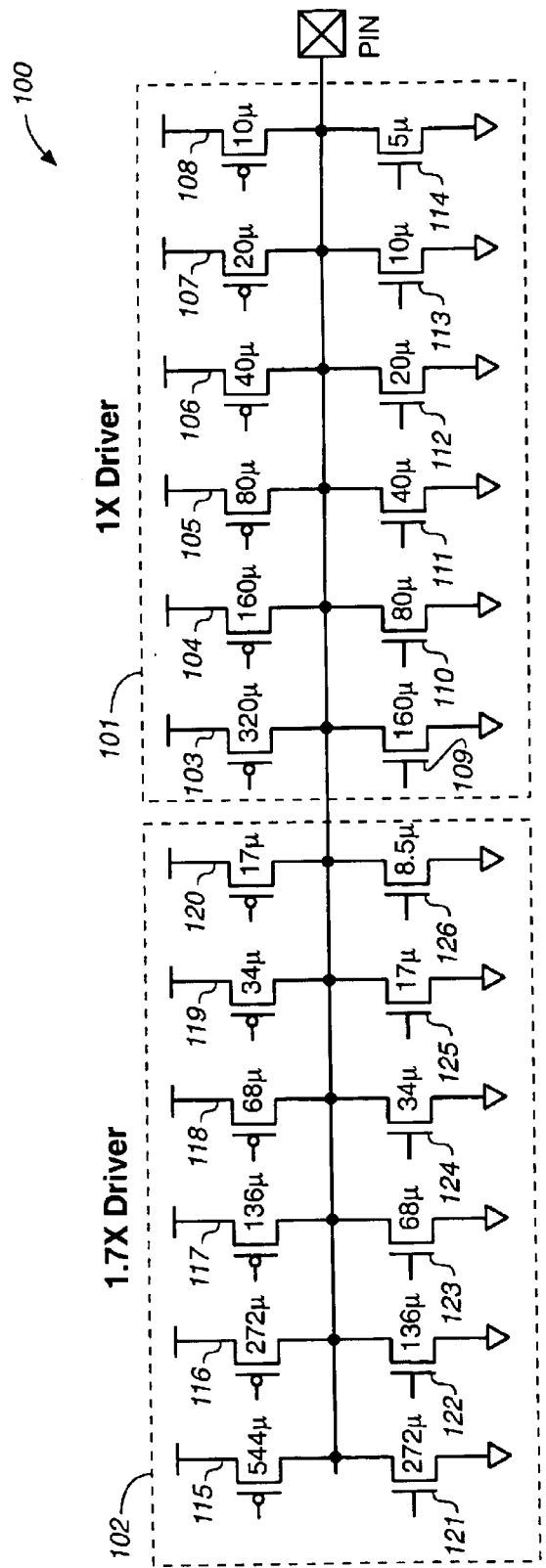
FIG._1
*(Prior Art)*

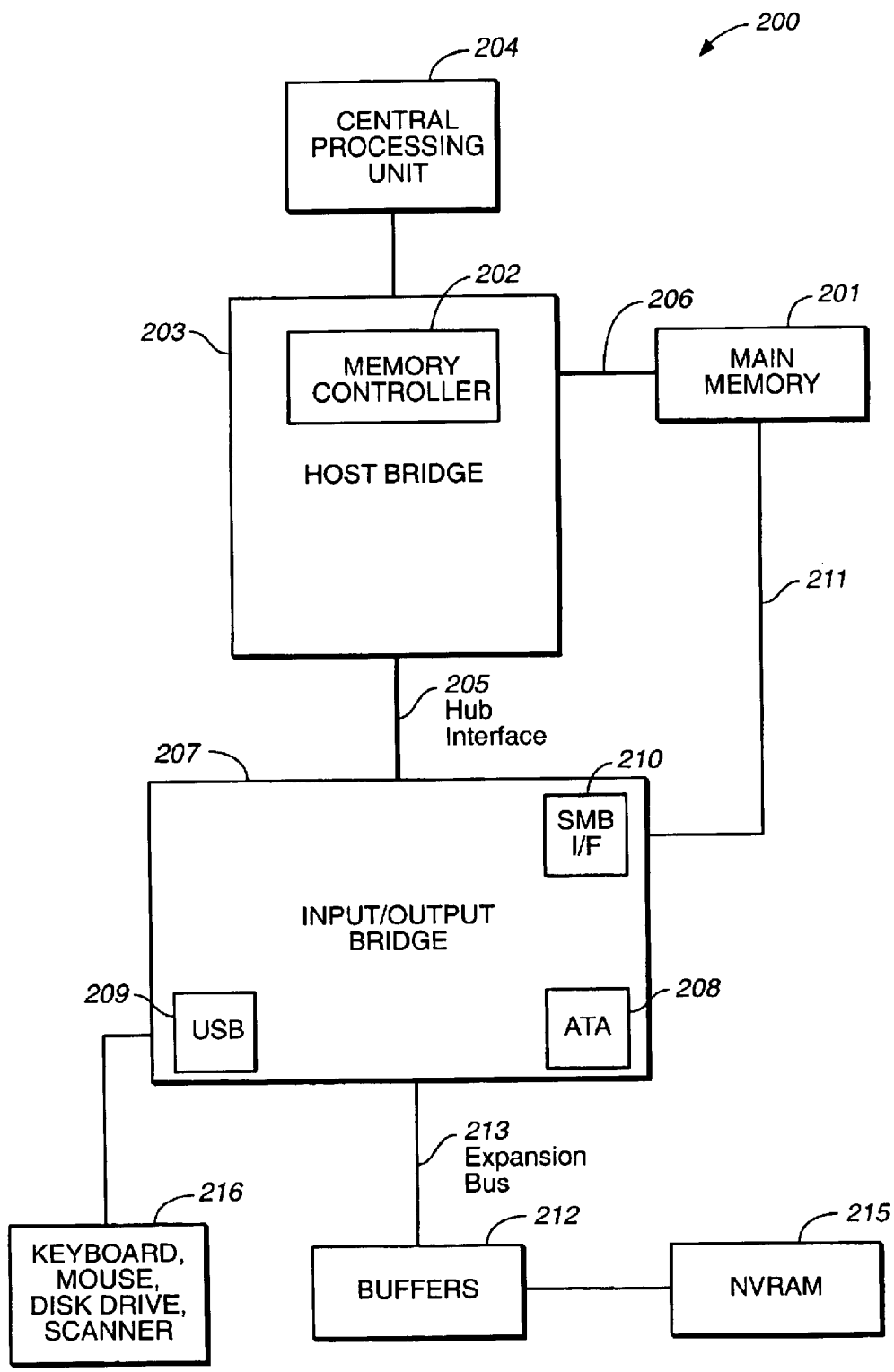
FIG._2

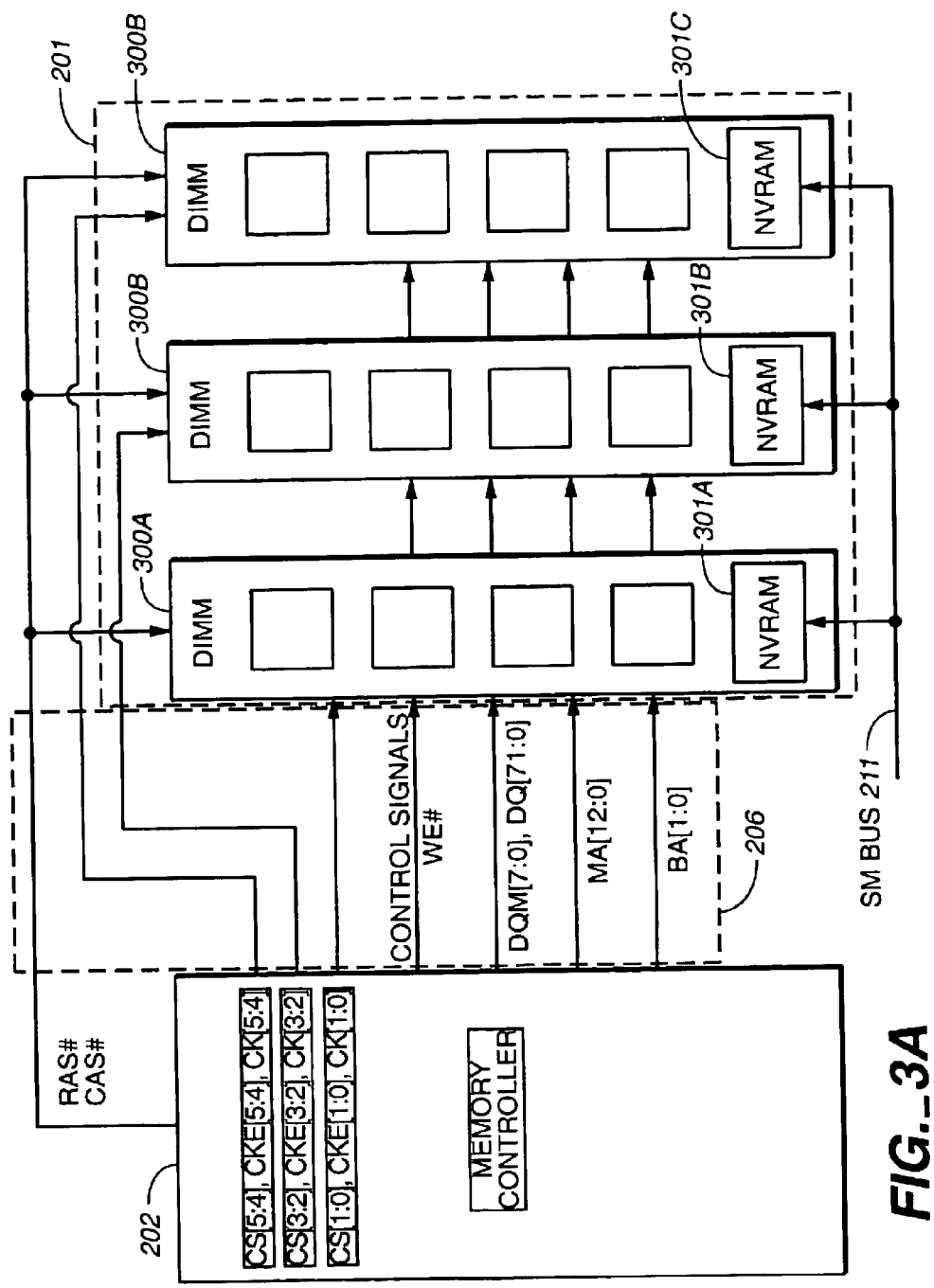
FIG._3A

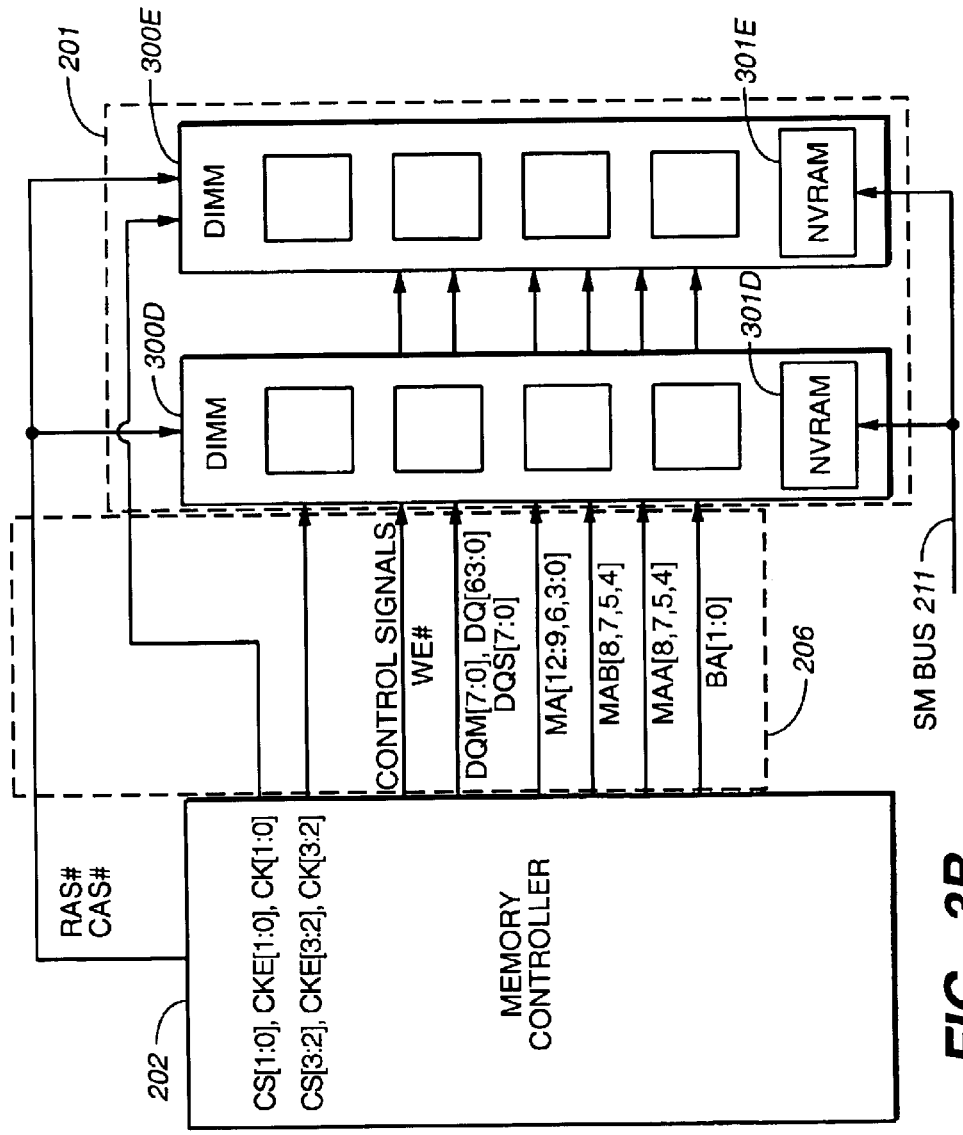
FIG._3B

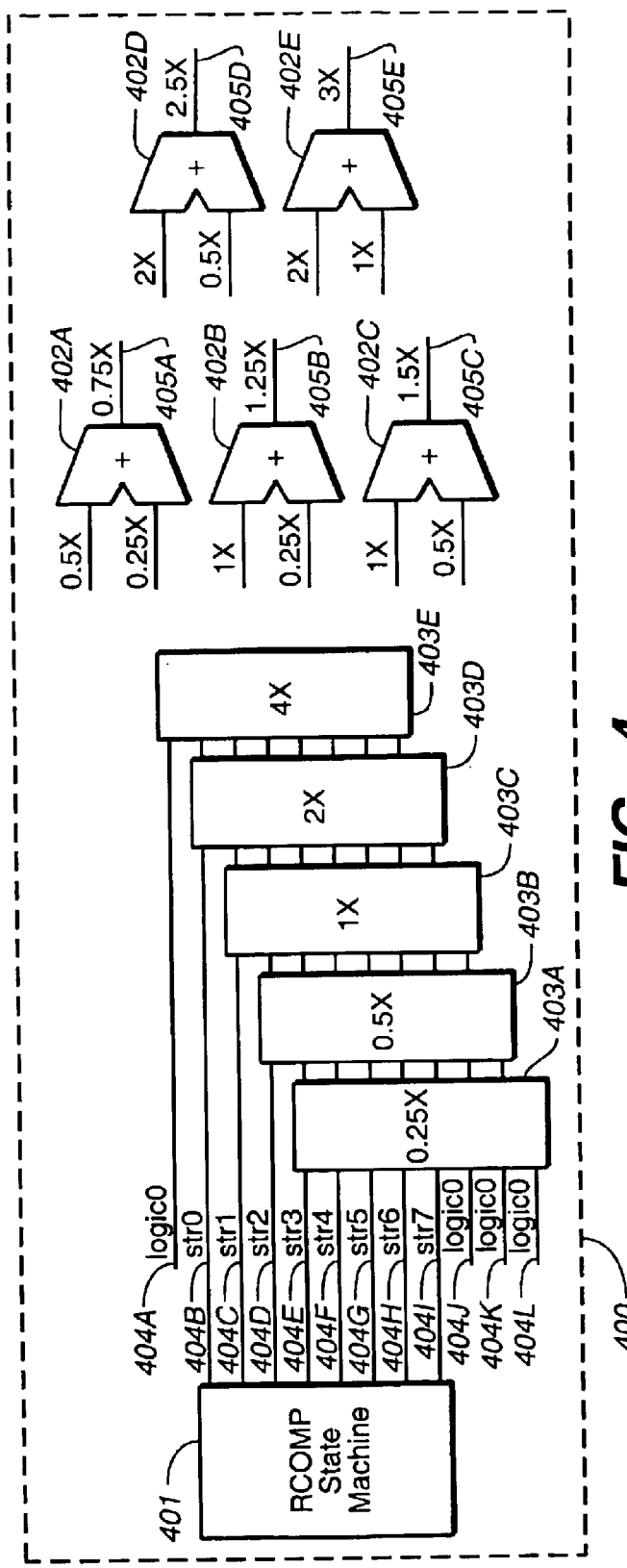
FIG._4

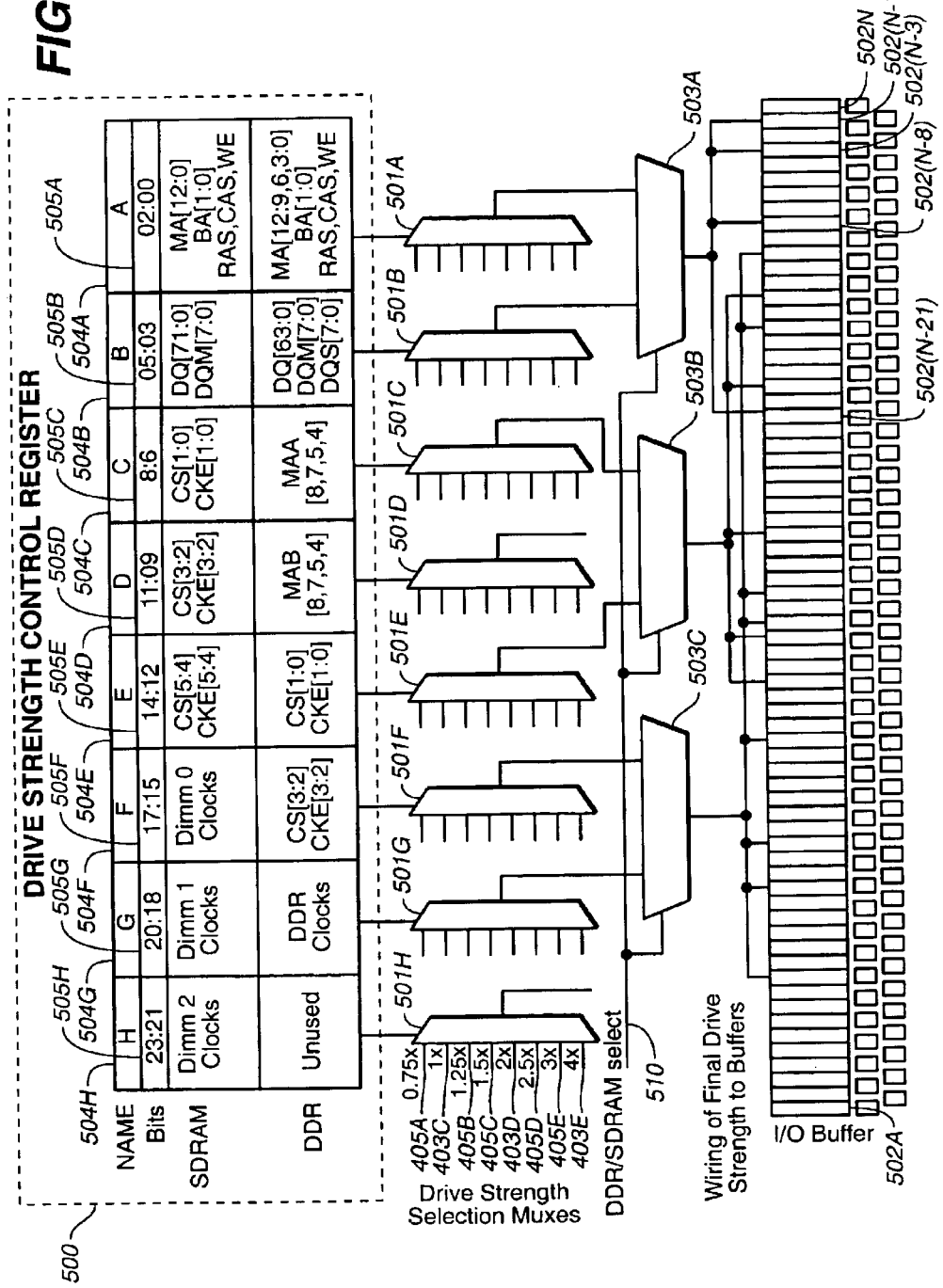
FIG._5

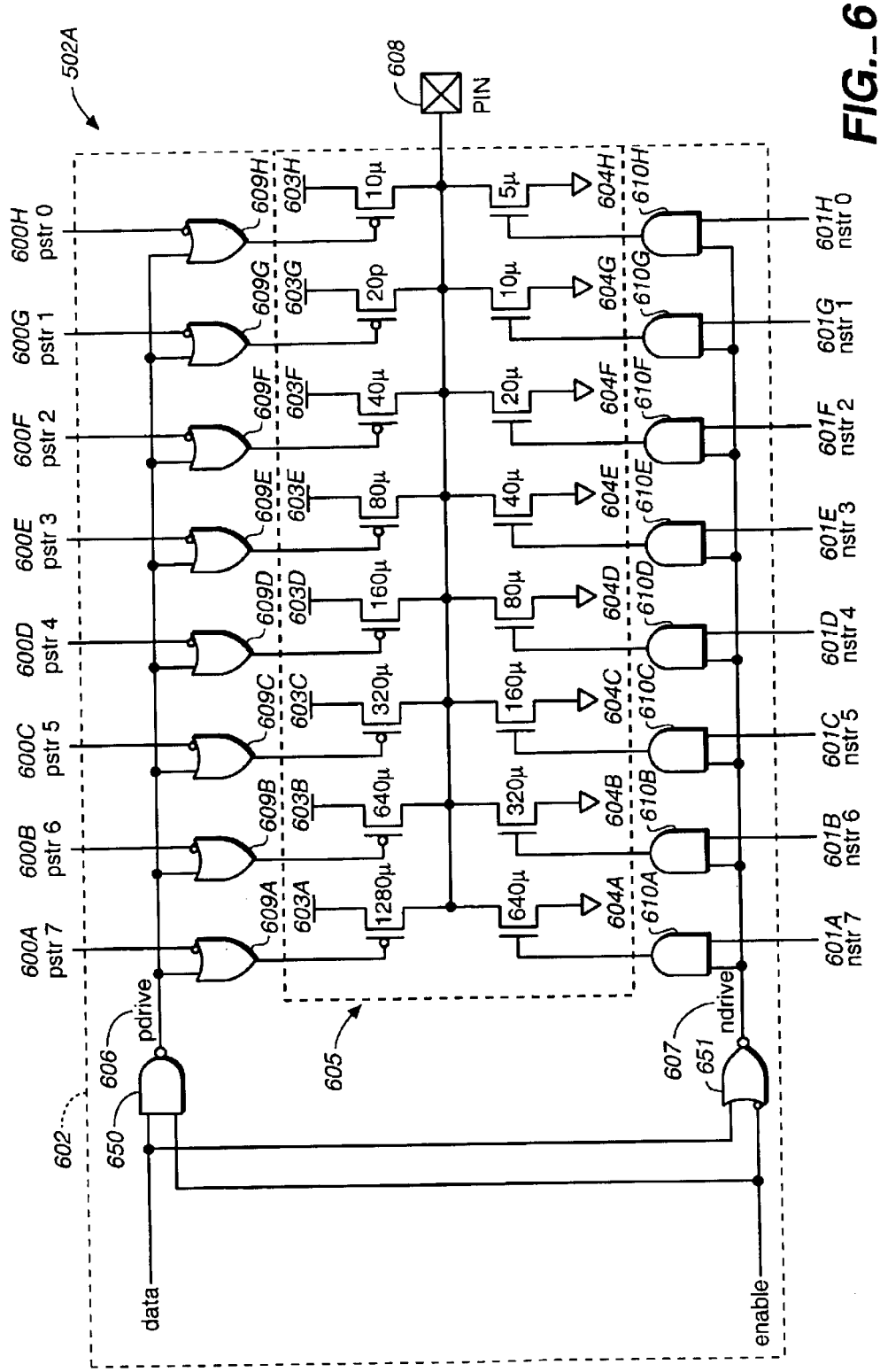
FIG._6

METHOD AND APPARATUS FOR GENERATING MULTIPLE SYSTEM MEMORY DRIVE STRENGTHS

BACKGROUND

This invention relates to a method and system for generating multiple system drive strengths in a memory controller.

A conventional computer system includes various types of memory components including main memory, video memory, cache memory, and buffers. Synchronous dynamic random access memories (SDRAMs) or double data rate (DDR) memories are popular memory component choices due to their relatively high access speeds and low cost.

Various techniques are used to mount these memory components, or chips, to a printed circuit board. One technique is to directly mount the memory chips to the board. To increase memory chip density, multiple memory chips may be mounted onto memory modules having interconnecting pins for connection or coupling to sockets on the board. The memory modules can be double in-line memory modules (DIMMs), or other type modules (e.g., multichip modules (MCMs)). Multiple sockets may be provided on each board to receive multiple memory modules, increasing memory capacity. Similarly, differing numbers of memory chips may be employed on any given board.

Often computers will contain a memory subsystem consisting of a number of memory chips controlled by a memory controller. The memory subsystem may comprise one or more DIMMS connected to one or more SDRAMs or DDRs. The memory controller may interface with the memory subsystem through a number of control, address, and data signals. As the number of memory chips within the memory subsystem increases, the loading placed on the control, address, and data signals also increases. The ideal output load impedance (i.e., the impedance seen on the pins caused by the load) may change from 60 ohms for a lightly loaded data signal to 15–20 ohms for a heavily loaded address signal. The system load per pin may change from 1 device load on a data line to 48 or more loads on an address line. A large change in the output impedance may cause a corresponding change in the switching characteristics of an output signal driven by the memory controller. Matching output drive strengths with output impedances will avoid these problems.

Referring to FIG. 1, one known method for matching memory controller drive strengths with output load impedance includes using an output driver 100 with resistive compensation (RCOMP) to generate predefined drive strengths of 1× (i.e., the drive strength generated by 1× driver 101 and equal to 1 times the drive strength required to drive a 60 ohm impedance) and 1.7× (i.e., the drive strength generated by 1.7× driver 102 and equal to 1.7 times the drive strength required to drive a 60 ohm impedance). The 1× driver 101 used to create the 1× drive strength includes 6 p-MOS transistors 103–108 used for pull-up compensation and 6 n-MOS transistors 109–114 used for pull-down compensation. The 1.7× driver 102 used to create the 1.7× drive strength includes 6 p-MOS transistors 115–120 used for pull-up compensation and 6 n-MOS transistors 121–126 used for pull-down compensation. The available driver drive strength options of output driver 100 are primary drive strengths 1× and 1.7×, and a combination of the two, 2.7×. The number of control signals required to generate these three drive strengths are 24, each control signal corresponding to a transistor 103–126.

By generating only three drive strengths, output driver 100 cannot ideally match a wide range of load impedances. For example, the minimum drive strength required to function in a heavily loaded system (a system with low impedance) produces significant overshoot and noise when used with a lightly loaded system (a system with high impedance).

One known method of expanding output driver 100 to produce greater granularity in drive strengths, and hence to provide better matching of impedances, is to increase the number of MOS transistors 103–126 and provide additional drivers in parallel. For example, an increase of the number of MOS transistors from 24 to 36 would provide an additional primary drive strength, resulting in seven total drive strengths.

As the number of drivers and corresponding MOS transistors increases, however, implementation of the wiring of the control signals to the output driver required for independent pull-up and pull-down compensation becomes increasingly complicated and difficult. Furthermore, the increase in the number of MOS transistor results in larger device costs and lower reliability rates.

DESCRIPTION OF DRAWINGS

FIG. 1 is a diagram of a prior art output driver using RCOMP.

FIG. 2 is a block diagram of a computer system.

FIG. 3A is a block diagram of the memory subsystem of FIG. 2.

FIG. 3B is a block diagram of a second embodiment of the memory subsystem of FIG. 2.

FIG. 4 is a diagram of a system for generating multiple system drive strengths.

FIG. 5 is a diagram of a drive strength control register and selection multiplexers.

FIG. 6 is a diagram of an output driver.

Like reference symbols in the various drawings indicate like elements.

DETAILED DESCRIPTION

FIG. 2 shows a computer system 200 with a main memory 201 that is controlled by a memory controller 202. The memory controller 202 may be a discrete chip or part of another controller, such as a host bridge 203 interfacing between a central processing unit (processor) 204 and a hub interface 205. The memory controller may be the 133-MHz SDRAM controller 830M, available from Intel Corp. of Santa Clara, Calif. The processor 204 may be the Mobile Intel® Pentium® III Processor-M available from Intel. A memory bus 206 provides a communication pathway between the main memory 201 and the memory controller 202 for control signals, address signals, and data signals.

The main memory 201 may be configured to any one of a number of different memory organizations, including organizations employing one single-sided DIMM module, or 2 double-sided DIMM modules. The DIMM modules may contain SDRAM or DDR memory. The system load per pin of the main memory organizations may change from 1 device load on a data line to 48 or more loads on an address line.

The host bridge 203 may be the 82830M (MP/M/MG) Graphics Memory Controller Hub (GMCH-M) available from Intel, which includes a number of integrated functions, including a processor system bus (PSB) controller, and a high-speed Accelerated Hub Architecture interface (e.g., hub interface 205). The architecture of the hub interface 205 is described in detail in the Intel 830 Chipset Family Platform Design Guide, published by Intel in October 2001. The host bridge 203 also includes an accelerated graphics port (AGP) interface (not shown) for use with AGP compliant devices. AGP is described in detail in the Advanced Graphic Port 2.0 specification, published by Intel May 4, 1998.

Host bridge 203 and main memory 201 both interface with an Input/Output (I/O) bridge 207 which provides an interconnection between various peripheral components within the system (e.g. a keyboard, disk drive, scanner, and/or a mouse (216)). The I/O bridge 207 may be the 82371SB part (the ICH3-M I/O bridge) available from Intel, which integrates an Ultra Advanced Technology Attachment (ATA) controller 208, a Universal Serial Bus (USB) (described in the Universal Serial Bus Specification, Revision 1.1, published by Intel on Sep. 23, 1998) host interface 209, and a system management (SM) bus interface 210 for coupling to an SM bus 211. The SM bus interface 210 may support the serial presence detect protocol. The serial presence detect protocol may be used to access predefined storage locations in the main memory 201 to determine the loading on the pins of the main memory 201. The serial presence detect protocol is a standard set by the Joint Electron Device Engineering Council (JEDEC). The standard is referred to as JEDEC Standard 21-C, Configurations for Solid State Memories, published by JEDEC September 2000.

I/O bridge 207 is coupled to buffers 212 through an expansion bus 213; and buffers 212 are in turn coupled to other components such as nonvolatile memory (NVRAM) 215. NVRAM 215 stores a basic input/output system (BIOS) routine, which is executed in the computer system 200 during initial start-up. In operation, the BIOS routine may be copied to the main memory 201.

Referring to FIG. 3A, in one aspect the main memory 201 includes sockets for receiving DIMM modules (DIMMs) 300A, 300B, and 300C. The DIMMs 300A, 300B, and 300C may be configured as single-sided or double-sided, and may include ×4, ×8, or ×16 SDRAMs. The main memory 201 may also be modified to include other types of memory modules, e.g., MCMs. The memory controller 202 provides various control, address, and data signals to the main memory 201 through a memory bus 206 with a predefined width. A memory data width may be 72 bits wide, corresponding to memory data bits DQ[71:0]. DQM[7:0] are output enable signals. The memory addresses are outputted from the memory controller 202 as MA[12:0]. CKE[1:0], a clock enable signal, is also provided to the SDRAM module connected to DIMM 300A. CKE[3:2], a clock enable signal, is provided to the SDRAM module connected to DIMM 300B. CKE[5:4] is provided to the SDRAM module connected to DIMM 300C. CK[5:4] are differential DIMM clock signals provided to the SDRAM module connected to DIMM 300C. CK[3:2] are differential DIMM clock signals provided to the SDRAM module connected to DIMM 300B. CK[1:0] are differential DIMM clock signals provided to the SDRAM module connected to DIMM 300A.

The address signals sent along memory bus 206 are time multiplexed into the DIMMs 300A, 300B, and 300C and are divided into row and column addresses. The address signals include:

(a) RAS#: the SDRAM row address strobe signal provided to SDRAM modules in DIMMs 300A, 300B, and 300C; (Throughout the specification, a signal name followed by a "#" symbol indicates that the signal is active low.)

(b) CAS#: the SDRAM column address strobe signal provided to the SDRAM modules in DIMMs 300A, 300B, and 300C;

(c) CS[1:0]: chip select bits provided to SDRAM modules in DIMM 300A;

(d) CS[3:2]: chip select bits provided to SDRAM modules in DIMM 300B;

(e) CS[5:4]: chip select bits provided to SDRAM modules in DIMM 300C; and (f) BA[1:0]: bank address bits provided to SDRAM modules in DIMMs 300A, 300B, and 300C.

An additional control signal includes:

(a) WE#: which is the write strobe signal provided to the SDRAM modules in DIMMs 300A, 300B, and 300C. Signals MA[12:0], BA[1:0], RAS#, CAS#, WE#, DQ[71:0], DQM[7:0], CS[1:0], CKE[1:0], CS[3:2], CKE[3:2], CS[5:4], CKE[5,4], CK[1:0], CK[3:2], and CK[5:4] are sent to the DIMMs 300A, 300B, and 300C via memory bus 206.

Referring to FIG. 3B, in an alternative embodiment of the memory subsystem of FIG. 2, the main memory 201 includes sockets for receiving DIMM modules (DIMMs) 300D and 300E. The DIMMs 300D and 300E may be configured as single-sided or double-sided, and may include ×4, ×8, or ×16 DDR memories.

The memory controller 202 provides various control, address, and data signals to the main memory 201 through a memory bus 206 with a predefined width. A memory data width may be 64 bits wide, corresponding to memory data bits DQ[63:0]. DQM[7:0] are output enable signals. DQS[7:0] is a data output strobe signal. The memory addresses are outputted from the memory controller 202 as MA[12:9, 6,3:0], MAA[8,7,5,4], and MAB[8,7,5,4]. CKE[1:0], a clock enable signal, is provided to the SDRAM module connected to DIMM 300E. CKE[3:2], a clock enable signal is provided to the SDRAM module connected to DIMM 300D. CK[1:0] and CK[3:2] are differential DDR clock signals provided to the SDRAM modules connected to DIMMs 300D and 300E.

The address signals sent along memory bus 206 are time multiplexed into the DIMMs 300D and 300E and are divided into row and column addresses. The address signals include:

(a) RAS#: the SDRAM row address strobe signal provided to SDRAM modules in DIMMs 300D and 300E;

(b) CAS#: the SDRAM column address strobe signal provided to the SDRAM modules in DIMMs 300D and 300E;

(c) CS[1:0]: chip select bits provided to SDRAM modules in DIMM 300E;

(d) CS[3:2]: chip select bits provided to SDRAM modules in DIMM 300D; and (e) BA[1:0]: bank address bits provided to SDRAM modules in DIMMs 300D and 300E.

The control signals sent along memory bus 206 include:

(a) WE#: the write strobe signal provided to the SDRAM modules in DIMMs 300D and 300E.

Signals MA[12:9,6,3:0], BA[1:0], RAS#, CAS#, WE#, DQ[63:0], DQM[7:0], DQS[7:0], MAA[8,7,5,4], MAB[8,7,5,4], CS[1:0], CKE[1:0], CS[3:2], CKE[3:2], CK[1:0], and CK[3:2] are sent to the DIMMs 300D and 300E via memory bus 206.

Referring to FIGS. 2, 3A and 3B, each DIMM 300A–E includes an NVRAM 301A–E configured according to the serial presence detect protocol and communicating with the I/O bridge 207 via SM Bus 211. The information stored in each NVRAM 301A–E indicates the type of memory module used, e.g., memory data width, memory size, DDR or SDRAM. Referring again to FIG. 2, during start-up, a BIOS routine executed by the processor 204 may program the SMB interface 210 in the I/O bridge 207, accessing predetermined locations in the NVRAMs 301A–E. Based on the accessed information, the loading on the pins of the DIMMs 300A–E is determined and configuration registers (not shown) in the memory controller 202 are programmed by the BIOS routine to configure the memory controller 202 to provide the appropriate signals to the main memory 201.

One configuration register includes a drive strength control register 500 (FIG. 5), which stores values for programming the drive strength of output drivers in the memory controller 202. Thus, with a large device load on a pin of DIMMs 300A–E, the output driver corresponding to the pin in the memory controller 202 may be programmed to have a large drive strength. In contrast, with a smaller device load on a pin of DIMMs 300A–E, the output driver corresponding to the pin may be programmed to have a smaller drive strength.

As explained in more detail below, the memory controller 202 is programmable to have different output driver strengths as set by the drive strength control register 500 depending upon the loading on the pins of the memory organization.

Referring to FIG. 4, a system 400 for generating multiple system memory drive strengths in the memory controller 202 (FIG. 2) is shown. The system 400 includes a single RCOMP state machine 401 and ripple carry adders (adders) 402A–E. The RCOMP state machine 401 generates an 8-bit word 403D corresponding to a 2× drive strength along the lines st0 (404B) through str7 (404I), where the 2× drive strength is twice the strength required of a 60 ohm motherboard. By selecting subsets of the eight bit value (by padding the most or least significant bits with zeros (shown in FIG. 4 as logic 0 404A, 404J, 404K, and 404L)), the system 400 is able to generate additional 8-bit words representative of drive strengths 0.25× 403A, 0.5× 403B, 1× 403C, and 4× 403E. For example, by padding the most significant bit with logic 0 404A, the system 400 can achieve a resulting drive strength of 4× (403E). Similarly, by padding the three least significant bits with logic 0 404J–L, the system 400 can achieve a drive strength of 0.25× (403A). Adders 402A–E add up combinations of the 8-bit words 403A–E to create additional drive strengths of 0.75× (405A), 1.25× (405B), 1.5× (405C), 2.5× (405D), and 3× (405E). Each adder 402A–E is 8-bits wide and is duplicated (not shown in diagram) for pull-up and pull-down strengths. The system 400 may include additional or fewer adders. The RCOMP state machine 401 may generate an output word corresponding to other sizes than an 8-bit word. Adders 402A–E may add any combination of drive strengths 403A–E, and may add more than two drive strengths together to produce a myriad of possible drive strengths. Adders 402A–E may add input words corresponding to sizes other than 8-bits and output word bit sizes other than 8-bits.

Referring to FIG. 5, memory controller 202 (FIG. 2) includes in part drive strength control register 500, multiplexers 501A–H, selectors 503A–C, and a number of programmable I/O buffers 502A–N, where N is a number corresponding to the total number of pins on the DIMMs 300A–E, as set by pstr 600A–H and nstr 601A–H parameters (FIG. 6). The pstr 600A–H and nstr 601A–H parameters will be explained in greater detail below. Each I/O buffer 502A–N is configurable to have one of several drive strengths, e.g., 0.75× (405A), 1× (403C), 1.25× (405B), 1.5× (405C), 2× (403D), 2.5× (405D), 3× (405E), or 4× (402E).

Referring to FIGS. 3A and 5, each field A–H 504A–H contains a 3-bit value 505A–H, respectively, representing the loading on a pin, where the information pertaining to the loading on the pin is contained within NVRAMs 301A, 301B, and 301C. A BIOS routine accesses predetermined locations in the NVRAMs 301A, 301B, and 301C, and based on the accessed information, the loading on the pins of the DIMMs 300A, 300B, and 300C is determined and 3-bit values 505A–H are programmed into fields A–H 504A–H. In one implementation, the BIOS routine programs the 3-bit values 505A–H based on the device load on the pins of the main memory 201 according to the following table:

| Device Load | 3-bit Value | Drive Strength Value |
|---|---|---|
| 1–8 | 001 | 1× (403C) |
| 9–12 | 010 | 1.25× (405B) |
| 13–16 | 011 | 1.5× (405C) |
| 17–24 | 100 | 2× (403D) |
| 25 or more | 101 | 2.5× (405D) |

For example the total MA[12:0], BA[1:0], RAS#, CAS#, and WE# device loads of field A 504A can be determined through the SM bus 211. The 3-bit value [2:0] 505A can be set according to the table above. A determination of the device loads on the pins of each field 504A–H in the drive strength control register 500 could be repeated, and the corresponding 3-bit values 505A–H can also be set according to the table above. However, different tables may be used among the fields 504A–H of the drive strength control register 500. For example, while bits [2:0] 505A may be set according to the table above, bits [5:3] 505B, which are used to set the drive strength of the DQ[63:0] and DQM[7:0] pins, may be set to <001> corresponding to a 1× (403C) drive strength for 1–2 device loads, <010> corresponding to a 1.25× (405B) drive strength for 3–4 device loads, and <011> corresponding to a 1.5× (405C) drive strength for 5 or more device loads.

In one implementation, each field 504A–H in the drive strength control register 500 has a 3-bit value 505A–H that is used, in conjunction with multiplexers 501A–H, to select one of the eight possible drive strengths. Each multiplexer 501A–H can be 16 bits wide, allocating eight bits each for pull-up strength and pull-down strength. A mode bit used to select between DDR/SDRAM adds another level of multiplexing, as shown by selectors 503A–C. A one-bit storage element (not shown) can be used to indicate that the main memory 201 is populated with SDRAM memory (e.g., a "0" setting) or DDR memory (e.g., a "1" setting). Selector 503A is coupled to 4 I/O buffers that are selectable between matching the drive strengths of signals MA[12:0], BA[1:0], RAS#, CAS#, and WE# of field A 504A for SDRAM or for matching the drive strengths of signals DQ[63:0], DQM[7:0], and DQS[7:0] of field B 504B for DDR memory. Similarly, another selector (not shown) may select between matching the drive strengths of signals MA[12:9,6,3:0], BA[1:0], RAS#, CAS#, and WE# of Field A 504A for DDR memory or for matching the drive strengths of signals DQ[71:0] and DQM[7:0] of Field B 504B for SDRAM. The actually location of selectors in FIG. 5 is by way of example only. Selectors may be connected in any number of configurations as long as the selectors are configured to select the desirable signals within the fields A–H 504A–H.

For an SDRAM memory configuration, bits [23:21] 505H select the buffer strength for pins of the DIMM 2 clocks. Bits

[20:18] 505G select the drive strength for pins of the DIMM 1 clocks. Bits [17:15] 505F select the drive strength for pins of the DIMM 0 clocks. Bits [14:12] 505E select the drive strength for pins CS[5:4] and CKE[5:4]. Bits [11:9] 505D select the drive strength for pins CS[3:2] and CKE[3:2]. Bits [8:6] 505C select the drive strength for pins CS[1:0] and CKE[1:0]. Bits [5:3] 505B select the drive strength for pins DQ[71:0] and DQM[7:0]. Bits [2:0] 505A select the drive strength for pins MA[12:0], BA[1:0], RAS#, CAS#, and WE#.

For a DDR memory configuration, bits [23:21] 505H are unused. Bits [20:18] 505G select the drive strength for pins of the DDR clocks. Bits [17:15] 505F select the drive strength for pins CS[3:2] and CKE[3:2]. Bits [14:12] 505E select the drive strength for pins CS[1:0] and CKE[1:0]. Bits [11:9] 505D select the drive strength for pins MAB[8,7,5,4]. Bits [8:6] 505C select the drive strength for pins MAA[8,7,5,4]. Bits [5:3] 505B select the drive strength for pins DQ[63:0], DQM[7:0], and DQS[7:0]. Bits [2:0] 505A select the drive strength for pins MA[12:9,6,3:0], BA[1:0], RAS#, CAS#, and WE#.

For example, a value of 0 may be stored in the one-bit storage element (not shown) indicating that DIMMs 300A, 300B, and 300C are connected to SDRAM. As with multiplexer 501H, multiplexer 501A selects between drive strengths of 0.75×–4×. A 3-bit value <011> may be programmed into Field A 504A representing the loading on the pins MA[12:0], BA[1:0], RAS#, CAS#, and WE#. Based on this 3-bit value, the drive strength 1.5× (405B) is selected from multiplexer 501A. Selector 503A receives the binary value 0 along DDR/SDRAM select line 510 and selects the 1.5× output from multiplexer 501A to I/O buffers 502(N-1), 502(N-3), 502(N-8) and 502(N-21) as the drive strength for pins MA[12:0], BA[1:0], RAS#, CAS#, and WE#.

Each I/O buffer 502A–N may contain circuitry as shown in FIG. 6.

Referring to FIGS. 5 and 6, each I/O buffer 502A–N, for example I/O buffer 502A, includes a decoder 602, an output driver 605, and an output pin 608. Decoder 602 includes two-input OR gates 609A–H connected to p-MOS transistors 603A–H. The decoder 602 also includes two-input AND gates 610A–H connected to n-MOS transistors 604A–H. The output driver 605 is configurable to have different drive strengths, as set by a pstr7-0 parameter 600A–H and a nstr7-0 parameter 601A–H. The parameters 600A–H and 601A–H correspond to eight bits each for pull-up strength and pull-down strength selected in multiplexers 501A–H. The output driver 605 is configurable to have one of several possible drive strengths, e.g., 0.75× (405A), 1× (403C), 1.25× (405B), 1.5× (405C), 2× (403D), 2.5× (405D), 3× (405E), or 4× (402E). Within decoder 602, the (inverted) pstr7-0 600A–H and nstr7-0 601A–H strength bits are used as inputs to the OR gates 609A–H and the AND gates 610A–H, respectively, to enable or disable the p-MOS transistors 603A–H and n-MOS transistors 604A–H. Signals pdrive 606 and ndrive 607, as the second inputs to the XORs 609A–H and AND gates 610A–H, respectively, are operable to enable the p-MOS transistors 603A–H and n-MOS transistors 604A–H, with enabled strength bits according to the following chart:

| ENABLE | DATA | PIN |
|---|---|---|
| 0 | 0 | Z |
| 0 | 1 | Z |
| 1 | 0 | 0 |
| 1 | 1 | 1 | where, Enable and Data indicate the inputs into NAND gate 650 and NOR gate 651, and a Pin 608 value of 0 indicates that the output driver is configured for driving the output pin 608 with a drive strength for pull-down compensation, a pin 608 value of 1 indicates that the output driver is configured for driving the output pin 608 with a drive strength for pull-up compensation, and a Pin 608 value of Z indicates the output driver is disabled.

For example, a 1.5× (405C) pull-up drive strength represented by 8-bits pstr<00111100> (600A–H) and a corresponding 1.5× pull-down drive strength represented by nstr<00110011> (601A–H) may be received by decoder 602 from selector 503A. When Enable and Data inputs into NAND gate 650 and NOR gate 651 are high, signal ndrive 607 is low, thus the n-MOS transistors 604A–H are disabled. The pdrive signal 606 is high, and p-MOS transistors 603C-F are enabled and a 1.5× (405C) drive strength used for pull-up compensation appears on the output pin 608 for driving pins MA[12:0], BA[1:0], RAS#, CAS#, and WE#.

A number of embodiments of the invention have been described. Nevertheless, it will be understood that various modifications may be made without departing from the spirit and scope of the invention. For example, specific signals and components have been identified in the memory controller. Moreover, drive strengths of less than 0.25 can be created by shifting and padding the 2× drive strength bits accordingly. The ability to program the output drive strengths of the output drivers may be applied to a memory controller with fewer output signals, e.g., a memory controller that supports only the SDRAM configuration or only the DDR configuration. In addition, the number of modules illustrated is only an example, as other combinations of memory modules may be used. A memory controller for use with other types of memory subsystems may also be configured to work with multiple memory organizations; such other memory subsystems include video memory, disk controller buffer memory, network controller buffer memory, etc. In addition, instead of programming a configuration register to program select the driver drive strengths in the first multiplexer stage, other configuration elements may be used, such as configuration pins that are coupled to different states for different drive strengths. Other output characteristics of the output drivers may also be controlled based on the different memory organizations, such other characteristics including the slew rate of the output driver, the output voltage (e.g., CMOS or TTL), etc. Accordingly, other embodiments are within the scope of the following claims.

What is claimed is:

1. A system for generating multiple drive strengths for one or more output signals of a memory controller, the memory controller operable to control a memory subsystem, the system comprising:

a state machine operable to generate an n-bit output representative of a drive strength operable to drive the one or more output signals; and a plurality of adders, each adder having a plurality of n-bit inputs, each input receiving a selective set of bits from the n-bit output of the state machine, the plurality of adders generating a plurality of n-bit outputs representative of a plurality of drive strengths operable to drive the one or more output signals.

2. The system of claim 1, wherein the plurality of adders are operable to generate the plurality of n-bit outputs in increments of less than or equal to 0.25 times a drive strength required by a motherboard operatively coupled to the memory subsystem.

3. The system of claim 1, the plurality of adders operable to generate the plurality of n-bit outputs in increments of less than or equal to 0.5 times a drive strength required by a motherboard operatively coupled to the memory subsystem.

4. The system of claim 1, wherein the state machine is a RCOMP state machine operable to generate the n-bit output representative of the drive strength.

5. The system of claim 1, further comprising:
a control register configured to store one or more control words representative of a loading on a pin of a memory organization of the memory subsystem; and
one or more multiplexers configured to receive the plurality of n-bit outputs from the plurality of adders, the n-bit output from the state machine, and shifted values of the n-bit output from the state machine, the one or more multiplexers operable to select as an operating drive strength, based on the one or more control words, one of the plurality of n-bit outputs from the plurality of adders, the n-bit output from the state machine, or one of the shifted values of the n-bit output from the state machine.

6. The system of claim 5, further comprising:
one or more output drivers operable to drive the one or more output signals; and
one or more decoders configured to receive the operating drive strength from one of the one or more multiplexers, the one or more decoders operable to adjust the one or more output drivers to operate at the operating drive strength.

7. The system of claim 6, further comprising:
one or more selectors, each selector coupled between two or more multiplexers and one or more decoders, the one or more selectors configured to receive two or more operating drive strengths from the two or more multiplexers, and operable to selectively couple one of the two or more operating drive strengths to the one or more decoders.

8. The system of claim 7, further comprising:
a storage element configured to store a memory value representative of the type of memory contained in the memory organization, the selectors operable to selectively couple one of the two or more operating drive strengths to the one or more decoders based on the memory value.

9. The system of claim 8, wherein the memory value is a binary number representing either synchronous dynamic random access memory (SDRAM) or double data rate (DDR) memory.

10. The system of claim 5, the control register configured to store one or more 3-bit control words representative of the loading on the pin of the memory organization.

11. The system of claim 7, wherein the plurality of adders are operable to generate the plurality of n-bit outputs in increments of less than or equal to 0.25 times a drive strength required by a motherboard operatively coupled to the memory subsystem.

12. The system of claim 7, the plurality of adders operable to generate the plurality of n-bit outputs in increments of less than or equal to 0.5 times a drive strength required by a motherboard operatively coupled to the memory subsystem.

13. A system comprising:
a memory subsystem with a memory organization containing a memory device; and
a memory controller operable to provide one or more output signals, the one or more output signals operatively coupled to the memory subsystem, the memory controller comprising:
a state machine operable to generate an n-bit output representative of a drive strength operable to drive the one or more output signals; and
a plurality of adders, each adder having a plurality of n-bit inputs, each input receiving a selective set of bits from the n-bit output of the state machine, the plurality of adders generating a
plurality of n-bit outputs representative of a
plurality of drive strengths operable to drive the one or more output signals.

14. The system of claim 13, the memory controller further comprising:
a control register configured to store one or more control words; and
one or more multiplexers configured to receive the plurality of n-bit outputs from the plurality of adders, the n-bit output from the state machine, and shifted values of the n-bit output from the state machine, the one or more multiplexers operable to select as an operating drive strength, based on the one or more control words, one of the plurality of n-bit outputs from the plurality of adders, the n-bit output from the state machine, or one of the shifted values of the n-bit output from the state machine.

15. The system of claim 14, further comprising:
a processor operable to execute a routine, the routine operable to determine a loading on one or more pins of the memory organization and to program in the control register one or more n-bit control words representative of the loading on the one or more pins.

16. The system of claim 15, the routine operable to program in the control register one or more 3-bit control words representative of the loading on the one or more pins.

17. The system of claim 15, the memory controller further comprising:
one or more output drivers operable to drive the one or more output signals; and
one or more decoders configured to receive the operating drive strength from one of the one or more multiplexers, the one or more decoders operable to adjust the one or more output drivers to operate at the operating drive strength.

18. The system of claim 17, the memory controller further comprising:
one or more selectors, each selector coupled between two or more multiplexers and one or more decoders, the one or more selectors configured to receive two or more operating drive strengths from the two or more multiplexers, and operable to selectively couple one of the two or more operating drive strengths to the one or more decoders.

19. The system of claim 18, the memory controller further comprising:
a storage element configured to store a memory value representative of the type of memory contained in the memory organization, the selectors operable to selectively couple one of the two or more operating drive strengths to the one or more decoders based on the memory value.

20. The system of claim 19, wherein the memory value is a binary number representing either synchronous dynamic random access memory (SDRAM) or double data rate (DDR) memory.

21. The system of claim 17, the memory organization including a double in-line memory module (DIMM) containing a nonvolatile memory (NVRAM) configured according to a serial presence detect protocol.

22. A method for generating multiple drive strengths for an output signal of a memory controller, the memory controller operable to control a memory subsystem, the method comprising:

generating an n-bit output representative of a drive strength operable to drive the output signal; and adding combinations of two or more selective sets of bits from the n-bit output to generate a plurality of n-bit outputs representative of a plurality of drive strengths operable to drive the output signal.

23. The method of claim 22, comprising adding combinations of the two or more selective sets of bits from the n-bit output to generate a plurality of n-bit drive strengths in increments of less than or equal to 0.25 times a drive strength required by a motherboard operatively coupled to the memory subsystem.

24. The method of claim 22, comprising adding combinations of the two or more selective sets of bits from the n-bit output to generate a plurality of n-bit drive strengths in increments of less than or equal to 0.5 times a drive strength required by a motherboard operatively coupled to the memory subsystem.

25. A method for controlling a memory subsystem having a memory organization in a system comprising:

determining a loading on a pin of the memory organization;

generating an n-bit output representative of a drive strength;

adding combinations of two or more selective sets of bits from the n-bit output to generate a plurality of n-bit outputs representative of a plurality of drive strengths; and adjusting an output driver of a memory controller operatively coupled to the memory subsystem to operate at one of the generated n-bit drive strengths based on the loading.

26. The method of claim 25, the determining step includes accessing a predetermined storage element in the memory subsystem to retrieve information pertaining to the loading on the pin of the memory organization.

* * * * *